US011591514B2

(12) United States Patent
Lieberman

(10) Patent No.: US 11,591,514 B2
(45) Date of Patent: Feb. 28, 2023

(54) SEMICONDUCTING LIGHT EMITTING NANOPARTICLE

(71) Applicant: MERCK PATENT GMBH, Darmstadt (DE)

(72) Inventor: Itai Lieberman, Dreieich (DE)

(73) Assignee: MERCK PATENT GMBH, Darmstadt (DE)

( * ) Notice: Subject to any disclaimer, the term of this patent is extended or adjusted under 35 U.S.C. 154(b) by 134 days.

(21) Appl. No.: 16/772,899

(22) PCT Filed: Dec. 11, 2018

(86) PCT No.: PCT/EP2018/084272
§ 371 (c)(1),
(2) Date: Jun. 15, 2020

(87) PCT Pub. No.: WO2019/115489
PCT Pub. Date: Jun. 20, 2019

(65) Prior Publication Data
US 2020/0308480 A1   Oct. 1, 2020

(30) Foreign Application Priority Data
Dec. 14, 2017   (EP) .................................... 17207524

(51) Int. Cl.
*C09K 11/02*   (2006.01)
*C09K 11/88*   (2006.01)
*H01L 51/00*   (2006.01)
*H01L 51/50*   (2006.01)
*B82Y 20/00*   (2011.01)
*B82Y 30/00*   (2011.01)
*B82Y 40/00*   (2011.01)

(52) U.S. Cl.
CPC .......... *C09K 11/025* (2013.01); *C09K 11/883* (2013.01); *H01L 51/004* (2013.01); *H01L 51/502* (2013.01); *B82Y 20/00* (2013.01); *B82Y 30/00* (2013.01); *B82Y 40/00* (2013.01)

(58) Field of Classification Search
CPC ..... C09K 11/025; C09K 11/883; C09K 11/88; C09K 11/02; H01L 51/004; H01L 51/502; B82Y 20/00; B82Y 30/00; B82Y 40/00
See application file for complete search history.

(56) References Cited

U.S. PATENT DOCUMENTS

| 8,221,651 B2 | 7/2012 | Murase et al. |
| 8,471,969 B2 | 6/2013 | Banin et al. |
| 9,529,228 B2 | 12/2016 | Banin et al. |
| 2005/0121648 A1 | 6/2005 | Hirai et al. |

(Continued)

FOREIGN PATENT DOCUMENTS

| WO | 10095140 A2 | 8/2010 |
| WO | 12059931 A1 | 5/2012 |

OTHER PUBLICATIONS

Goncalves et al., "Surface modification of Graphene . . . "; Chem. Mater., vol. 21, 2009, 4796-4802.

(Continued)

*Primary Examiner* — Jonathan Han
(74) *Attorney, Agent, or Firm* — Millen, White, Zelano & Branigan, PC; Ryan Pool

(57) ABSTRACT

The present invention relates to semiconducting light emitting nanoparticles and compositions.

17 Claims, 3 Drawing Sheets

(56) References Cited

U.S. PATENT DOCUMENTS

| | | | |
|---|---|---|---|
| 2010/0086488 A1 | 4/2010 | Hoheisel et al. | |
| 2010/0113813 A1* | 5/2010 | Pickett | C09C 1/04 |
| | | | 977/774 |
| 2013/0099213 A1* | 4/2013 | Jun | H01L 33/501 |
| | | | 257/E51.026 |
| 2013/0169904 A1 | 7/2013 | Kang et al. | |
| 2014/0001405 A1* | 1/2014 | Guo | C09K 11/565 |
| | | | 423/299 |
| 2017/0082896 A1* | 3/2017 | Jang | G02F 1/133603 |

OTHER PUBLICATIONS

Li et al., J. "One pot Synthesis . . . ": Am. Chem. Soc. 2008, 130, 11588-11589.

Virieux et al., "InP/ZnS Nanocrystals: . . . " J. Am. Chem. Soc. 2012, 134, 19701-19708.

Cunningham et al., "Assessment of Anisotropic Semiconductor Nanorod . . . ": ACS Nano, 2016, 10(6), pp. 5769-5781.

Tessier et al., "Economic and Size-Tunable Synthesis . . . "; Chem. Mater. 2015, 27, 4893-4898.

International Search report PCT/EP2018/084272 dated Feb. 22, 2019 (pp. 1-3).

Office Action in corresponding JP application 2020-532675 dated Oct. 25, 2022 (pp. 1-3 ) and english language translation thereof.

* cited by examiner

SEMICONDUCTING LIGHT EMITTING NANOPARTICLE

FIELD OF THE INVENTION

The present invention relates to a semiconducting light emitting nanoparticle and to a process for preparing a semiconducting light emitting nanoparticle. Further, the present invention relates to a composition and a formulation comprising at least a semiconducting light emitting nanoparticle, and to the use of said semiconducting light emitting nanoparticle or said composition or formulation in an optical device.

BACKGROUND ART AND PROBLEM TO BE SOLVED

US 2016/289552 A1 describes a composition comprising a plurality of quantum dots, resin and a metal (zinc) thiol polymer WO 2016/168048 A1 discloses a quantum dot film article comprising a quantum dot of a cured thiol-alkene-epoxy matrix.

US 2016/264820 A1 mentions a composite of InP/ZnS semiconductor nanocrystals and oligomer mixture.

U.S. Pat. No. 8,709,600 B2 describes a use of a poly ethylene co acrylic acid to encapsulate various kinds of nanoparticles.

US 2017/082896 A1 discloses a use of poly zinc carboxylate as a ligand for quantum materials. However, the poly zinc carboxylate was not used as the matrix itself.

Semiconducting light emitting nanoparticles are of great interest for use in optical devices, such as light emitting diodes (LEDs) and liquid crystal displays (LCDs), due to their narrow fluorescence emission. Using fluorescent quantum dots for applications such as down conversion layers in LCDs or color filters and color convertors directly applied on top of LEDs requires the quantum dots to be incorporated into a thin layer that provides protection for the nanocrystals. Typically, polymer films of acrylates, siloxanes, silazanes, epoxies or silicones which contain the quantum dots are used for this purpose.

However, the emission quantum yield of quantum dots drops when they are incorporated into this kind of films or layers.

Thus, there are still considerable problems related to the semiconducting light emitting nanoparticles and the film material for which improvement is desired.

In particular, there is a need for a novel semiconducting light emitting nanoparticle, which shows improved quantum yield, and which enables long term stable emission of the semiconducting light emitting nanoparticle. Also, a film or matrix material is desired, which increases the initial quantum yield and the quantum yield stability of quantum dots incorporated therein. Further, a novel semiconducting light emitting nanoparticle is desired, which comprises a ligand, in which the attaching group can well cover the surface of the semiconducting light emitting nanoparticle. In addition, a simple preparation process for making an optical medium comprising a semiconductor nanocrystal is requested.

It is therefore an object of the present invention to solve one or more of the above-mentioned problems.

SUMMARY OF THE INVENTION

The present inventors have surprisingly found that one or more of the above described problems can be solved by the features as defined in the claims.

In particular, in order to solve these problems the present invention provides for a semiconducting light emitting nanoparticle comprising at least a core, one or more shell layers and an attaching group attached to the outermost surface of the one or more shell layers, wherein the attaching group is a metal carboxylate polymer, a metal phosphonate polymer or a metal xanthate polymer, or a combination thereof, comprising at least one structural unit (A) and at least one structural unit (B), wherein, structural unit (A) is a straight-chain alkylene group having 1 to 20 C atoms or a branched alkylene group having 3 to 20 C atoms, where one or more H atoms in said straight-chain and branched alkylene groups may in each case be replaced by a group selected from carboxylate, sulfonate, sulfate, carbonate, phosphate, phosphonate and boronate; and structural unit (B) is represented by the following chemical formula (I):

formula (I)

in which:

$R^1$ denotes hydrogen or a methyl group, ethyl group;

$R^2$ denotes a single bond, a straight-chain alkylene group having 1 to 20 C atoms, or branched alkylene group having 3 to 20 C atoms, where one or more non-adjacent methylene structural units (—$CH_2$—) in said straight-chain and branched alkylene groups may in each case be replaced by a sulfonyl group, a carbonyl group, an ether group, a sulfide group, a sulfoxide group, an ester group, an amide group or an imine group, or a straight-chain alkenylene group having 2 to 20 C atoms or a branched alkenylene group having 3 to 20 C atoms, where one or more methylene structural units (—$CH_2$—) in said straight-chain and branched alkenylene groups may in each case be replaced by a sulfonyl group, a carbonyl group, an ether group, a sulfide group, a sulfoxide group, an ester group, an amide group or an imine group;

W denotes a carboxylate group (—COOM), a primary (—PO(OH)(OM)) or secondary (—$PO(OM)_2$) phosphonate group, or a xanthate group (—$OCS_2M$);

X denotes hydrogen, a carboxyl group (—COOH) or a carboxylate group (—COOL), a phosphonyl group (—$PO(OH)_2$) or a primary (—PO(OH)(OL)) or secondary (—$PO(OL)_2$) phosphonate group, or a xanthate group (—$OCS_2L$);

M denotes a metal cation selected from $½Zn^{2+}$ or $½Cd^{2+}$ or $⅓In^{3+}$; and L denotes a metal cation selected from $½Zn^{2+}$ or $½Cd^{2+}$ or $⅓ In^{3+}$.

The negatively charged polymer and the positively charged metal ion (e.g. $Zn^{2+}$) of the attaching group compensate each other as described in the following formula (I').

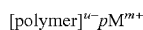

[polymer]$^{u-}pM^{m+}$     (I')

wherein symbol p, m, u are each independently an integer, p*m=u.

The above-mentioned problems are also solved by a composition comprising at least a semiconducting light emitting nanoparticle, in particular the semiconducting light emitting nanoparticle as defined above, and a matrix material comprising at least one metal carboxylate polymer, metal phosphonate polymer or metal xanthate polymer, or a combination thereof.

The above-mentioned problems are also solved by a process for preparing a semiconducting light emitting nanoparticle, wherein the process comprises the following step (a):
(a) providing the at least one metal carboxylate polymer, metal phosphonate polymer or metal xanthate polymer, or a combination thereof, and a semiconducting light emitting nanoparticle comprising a core and one or more shell layers into a solvent to get a mixture.

The present invention also relates to a semiconducting light emitting nanoparticle obtainable or obtained from the process.

Further, the present invention relates to a formulation comprising the semiconducting light emitting nanoparticle or the composition and at least one solvent.

In addition, the present invention relates to the use of the semiconducting light emitting nanoparticle or the composition or the formulation in an electronic device, optical device or in a biomedical device.

The present invention also relates to an optical medium comprising the semiconducting light emitting nanoparticle or the composition.

The present invention further relates to an optical device comprising the optical medium.

Further advantages of the present invention will become evident from the following detailed description.

DETAILED DESCRIPTION OF THE INVENTION

Figure 1:
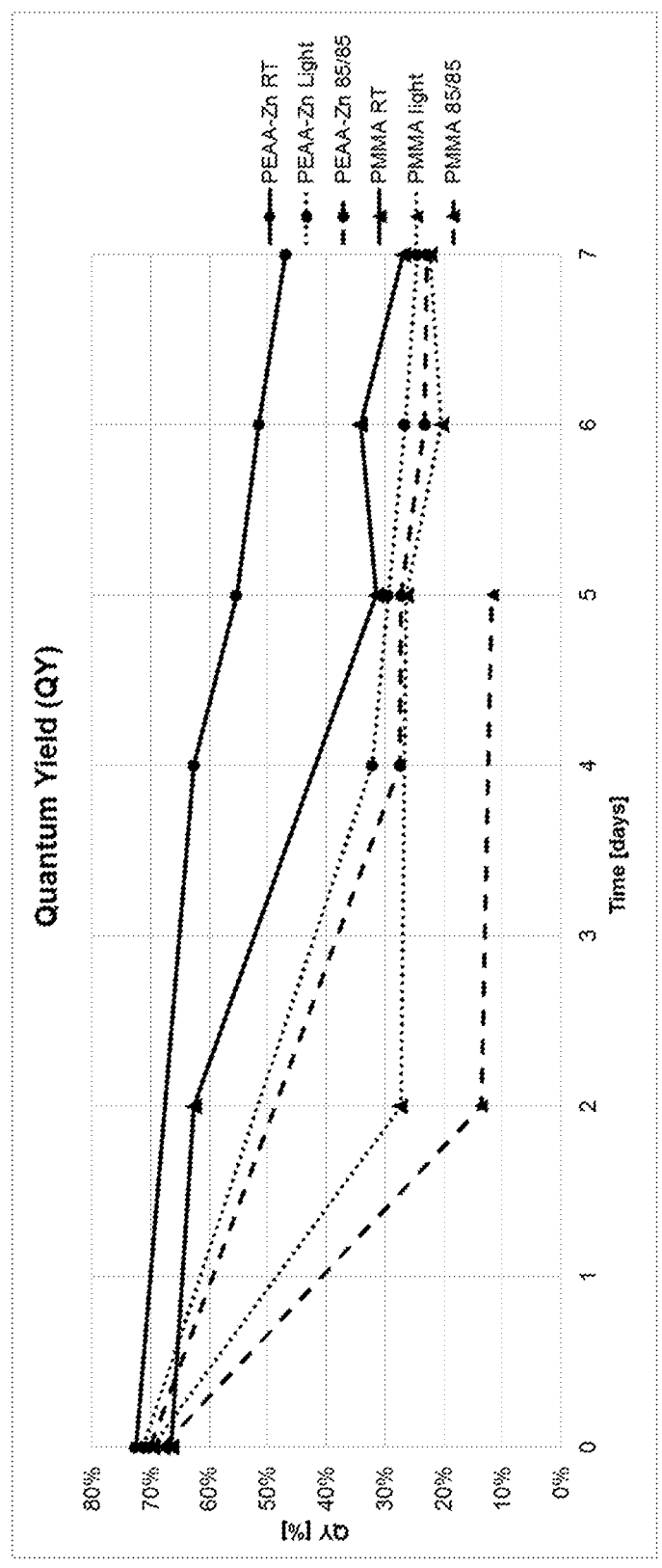
FIG. 1 is a graph of quantum yield over time showing the results of quantum yield measurements at different test conditions of quantum material containing films obtained from working example 1 and comparative example 1.

The present invention provides for a semiconducting light emitting nanoparticle comprising at least a core, one or more shell layers and an attaching group attached to the outermost surface of the one or more shell layers, wherein the attaching group is a metal carboxylate polymer, a metal phosphonate polymer or a metal xanthate polymer, or a combination thereof, comprising at least one structural unit (A) and at least one structural unit (B), wherein,
structural unit (A) is a straight-chain alkylene group having 1 to 20 C atoms or a branched alkylene group having 3 to 20 C atoms, where one or more H atoms in said straight-chain and branched alkylene groups may in each case be replaced by a group selected from carboxylate, sulfonate, sulfate, carbonate, phosphate, phosphonate and boronate; and structural unit (B) is represented by the following chemical formula (I):

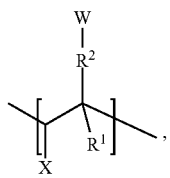

formula (I)

in which:
$R^1$ denotes a hydrogen, methyl group, ethyl group, propyl group, butyl group, pentyl group, hexyl group, heptyl group, octyl group, nonyl group, or a decyl group, preferably a hydrogen, methyl group, or an ethyl group, more preferably a hydrogen or a methyl group;
$R^2$ denotes a single bond, a straight-chain alkylene group having 1 to 20 C atoms, or branched alkylene group having 3 to 20 C atoms, where one or more non-adjacent methylene structural units (—$CH_2$—) in said straight-chain and branched alkylene groups may in each case be replaced by a sulfonyl group, a carbonyl group, an ether group, a sulfide group, a sulfoxide group, an ester group, an amide group or an imine group, or a straight-chain alkenylene group having 2 to 20 C atoms or a branched alkenylene group having 3 to 20 C atoms, where one or more methylene structural units (—$CH_2$—) in said straight-chain and branched alkenylene groups may in each case be replaced by a sulfonyl group, a carbonyl group, an ether group, a sulfide group, a sulfoxide group, an ester group, an amide group or an imine group;
W denotes a carboxylate group (—COOM), a primary (—PO(OH)(OM)) or secondary (—PO(OM)$_2$) phosphonate group, or a xanthate group (—OCS$_2$M);
X denotes hydrogen, a carboxyl group (—COOH) or a carboxylate group (—COOL), a phosphonyl group (—PO(OH)$_2$) or a primary (—PO(OH)(OL)) or secondary (—PO(OL)$_2$) phosphonate group, or a xanthate group (—OCS$_2$L);
M denotes a metal cation selected from ½$Zn^{2+}$ or ½$Cd^{2+}$ or ⅓$In^{3+}$; and
L denotes a metal cation selected from ½$Zn^{2+}$ or ½$Cd^{2+}$ or ⅓$In^{3+}$.

Preferably, the metal carboxylate polymer, metal phosphonate polymer or metal xanthate polymer essentially consists of or consists of structural units (A) and (B).

The weight average molecular weight (Mw) of the metal carboxylate, phosphonate or xanthate polymer, or combination thereof, representing the attaching group according to the present invention is not particularly limited, but is preferably in the range of 1,000 g/mol to 20,000 g/mol, more preferably in the range of 1,000 g/mol to 10,000 g/mol, particular preferably in the range of 1,000 g/mol to 5,000 g/mol and most preferably in the range of 1,000 g/mol to 2,000 g/mol.

The following definitions apply to the chemical groups used as general definitions. They only apply insofar as no more specific definitions are given.

For the purposes of the present invention, a straight-chain alkylene group having 1 to 20 C atoms, a branched alkylene group having 3 to 20 C atoms, a straight-chain alkenylene group having 2 to 20 C atoms or a branched alkenylene group having 3 to 20 C atoms, in which, in addition, individual H atoms or methylene structural units (—$CH_2$—) may be substituted by the groups mentioned above, is preferably taken to mean the groups methylene, ethylene, n-propylene, i-propylene, n-butylene, i-butylene, s-butylene, t-butylene, 2-methylbutylene, n-phenylene, s-phenylene, cyclopentylene, neopentylene, n-hexylene, neohexylene, n-heptylene, n-octylene, n-nonylene, 2-ethylhexylene, ethenylene, propenylene, butenylene, pentenylene, hexenylene, heptenylene, octenylene or nonenylene.

Preferably, structural unit (A) is a straight-chain alkylene group having 1 to 6 C atoms, in which one or more H atoms may be replaced by a group selected from carboxylate, sulfonate, sulfate, carbonate, phosphate, phosphonate and boronate. More preferably, none of the H atoms is replaced.

Furthermore, in structural unit (B) preferably $R^2$ denotes a single bond. This means that the group W is directly bound to the polymer chain, for example, a carboxylate group (—COOM) is directly bound to the polymer chain via its C atom.

Further preferably, group W denotes a carboxylate group (—COOM).

X preferably denotes hydrogen, a carboxyl group (—COOH) or a carboxylate group (—COOL), more preferably hydrogen or a carboxylate group (—COOL), and most preferably X is hydrogen.

It is preferable according to the present invention that the above defined metal carboxylate, phosphonate or xanthate polymer representing the attaching group comprises about 1 mol % to about 99.9 mol %, preferably about 1 mol % to about 90 mol %, more preferably about 2 mol % to about 50 mol %, and most preferably about 4 mol % to about 20 mol % of the structural unit (B), and about 99 mol % to about 0.1 mol %, preferably about 99 mol % to about 10 mol %, more preferably about 98 mol % to about 50 mol %, and most preferably about 96 mol % to about 80 mol % of the structural unit (A). When the structural unit (B) is included in the metal carboxylate, phosphonate or xanthate polymer representing the attaching group within the above ranges, the stability of the semiconducting nanocrystal may be improved.

It is further preferable according to the present invention that the metal cation is present in the metal carboxylate, phosphonate or xanthate polymer representing the attaching group in an amount of about 0.1 to about 1.5 mole, preferably about 0.3 mole to about 1.5 mole, more preferably about 0.3 mole to 1.0 mole, based on 1 mole of the structural unit (B). Within the above ranges, the metal cation can be easily bound to the carboxylate anion group.

The bond between the metal cation and the carboxylate, phosphonate or xanthate anion group may be a coordinative bond or an ionic bond. As a result of the bond between the metal cation and the carboxylate, phosphonate or xanthate anion group the polymer chains are more tightly adhered to one another to provide a polymer network.

As mentioned above, metal carboxylate polymers are preferable as the attaching group of the semiconducting light emitting nanoparticle according to the present invention.

More preferably, the metal carboxylate polymer attached to the outermost surface of the one or more shell layers in the semiconducting light emitting nanoparticle is selected from zinc poly(alkylene-co-acrylic acid), zinc poly(alkylene-co-methacrylic acid) and zinc poly(alkylene-co-maleic acid) salt. The alkylene structural unit (monomer), corresponding to structural unit (A), is preferably selected from ethylene, n-propylene and n-butylene. Particularly preferred specific metal carboxylate polymers are zinc poly(ethylene-co-acrylic acid), zinc poly(ethylene-co-methacrylic acid) and zinc poly(ethylene-co-maleic acid), wherein zinc poly(ethylene-co-acrylic acid) is most preferred.

In some embodiments of the present invention, preferably the amount of metal carboxylate, phosphonate or xanthate polymer comprising at least one structural unit (A) and at least on structural unit (B) as defined above being attached to the outermost surface of the one or more shell layers of the semiconducting nanoparticle may be about 50 to about 10,000 parts by weight, preferably about 50 to about 5,000 parts by weight, more preferably about 100 to about 1,000 parts by weight, based on 100 parts by weight of the semiconducting nanoparticle, in order to sufficiently stabilize the semiconducting nanoparticle.

Semiconducting Light Emitting Nanoparticle:

According to the present invention, as an inorganic part of the semiconducting light emitting nanoparticle, a wide variety of publicly known semiconducting light emitting nanoparticles can be used as desired.

A type of shape of the semiconducting light emitting nanoparticle of the present invention is not particularly limited. Any type of semiconducting light emitting nanoparticles, for examples, spherical shaped, elongated shaped, star shaped, polyhedron shaped semiconducting light emitting nanoparticles, can be used.

According to the present invention, said one or more shell layers of the semiconducting light emitting nanoparticle is preferably a single shell layer, a double shell layer, or multishell layers having more than two shell layers, most preferably it is a double shell layer.

As used herein, the term "shell layer" means the structure covering fully or partially said core. Preferably, said one or more shell layers fully covers said core. The terms "core" and "shell" are well known in the art and typically used in the field of quantum materials, such as U.S. Pat. No. 8,221,651 B2.

As used herein, the term "nano" means the size in between 0.1 nm and 999 nm, preferably, it is from 0.1 nm to 150 nm.

In a preferred embodiment of the present invention, the semiconducting light emitting nanoparticle of the present invention is a quantum sized material.

As used herein, the term "quantum sized" means the size of the semiconductor material itself without ligands or another surface modification, which can show the quantum confinement effect, like described in, for example, ISBN: 978-3-662-44822-9. Generally, it is said that the quantum sized materials can emit tunable, sharp and vivid colored light due to "quantum confinement" effect.

Preferably, the size of the overall structure of the quantum sized material is from 1 nm to 100 nm, more preferably, it is from 1 nm to 30 nm, even more preferably, it is from 5 nm to 15 nm.

According to the present invention, said core of the semiconducting light emitting nanoparticle can vary. For example, CdS, CdSe, CdTe, ZnS, ZnSe, ZnSeS, ZnTe, ZnO, GaAs, GaP, GaSb, HgS, HgSe, HgSe, HgTe, InAs, InP, InPS, InPZnS, InPZn, InPGa, InSb, AlAs, AlP, AlSb, $Cu_2S$, $Cu_2Se$, CuInS2, $CuInSe_2$, $Cu_2(ZnSn)S_4$, $Cu_2(InGa)S_4$, $TiO_2$ alloys and a combination of any of these can be used.

In a preferred embodiment of the present invention, said core of the semiconducting light emitting nanoparticle comprises one or more of group 13 elements of the periodic table and one or more of group 15 elements of the periodic table. For example, GaAs, GaP, GaSb, InAs, InP, InPS, InPZnS, InPZn, InPGa, InSb, AlAs, AlP, AlSb, CuInS2, $CuInSe_2$, $Cu_2(InGa)S_4$, and a combination of any of these.

Even more preferably, the core comprises In and P atoms, for example, InP, InPS, InPZnS, InPZn or InPGa.

According to a further preferred embodiment of the present invention, said at least one of the shell layers comprises a $1^{st}$ element of group 12, 13 or 14 of the periodic table and a $2^{nd}$ element of group 15 or 16 of the periodic table. Preferably, all shall layers comprise a $1^{st}$ element of group 12, 13 or 14 of the periodic table and a $2^{nd}$ element of group 15 or 16 of the periodic table.

More preferably, at least one of the shell layers comprises a $1^{st}$ element of group 12 of the periodic table and a $2^{nd}$ element of group 16 of the periodic table. For example, CdS, CdZnS, ZnS, ZnSe, ZnSSe, ZnSSeTe, CdS/ZnS, ZnSe/ZnS or ZnS/ZnSe shell layers can be used. Even more preferably, all shall layers comprise a $1^{st}$ element of group 12 of the periodic table and a $2^{nd}$ element of group 16 of the periodic table.

Particularly preferably, at least one shell layer is represented by following formula (II),

$$ZnS_xSe_yTe_z, \quad (II),$$

in which $0 \leq x \leq 1$, $0 \leq y \leq 1$, $0 \leq z \leq 1$, and $x+y+z=1$, with $0 \leq x \leq 1$, $0 \leq y \leq 1$, $z=0$, and $x+y=1$ being even more preferred.

ZnS, ZnSe, ZnSeS, ZnSeSTe, CdS/ZnS, ZnSe/ZnS, ZnS/ZnSe shell layers are most preferably used.

It is further preferred that all shell layers are represented by formula (II).

For example, as a semiconducting light emitting nanoparticle for green and/or red emission use, CdSe/CdS, CdSeS/CdZnS, CdSeS/CdS/ZnS, ZnSe/CdS, CdSe/ZnS, InP/ZnS, InP/ZnSe, InP/ZnSe/ZnS, InP/ZnS/ZnSe, InPZn/ZnS, InPZn/ZnSe/ZnS, InPZn/ZnS/ZnSe, ZnSe/CdS, ZnSe/ZnS semiconducting light emitting nanoparticle or combination of any of these, can be used.

More preferably, InP/ZnS, InP/ZnSe, InP/ZnSe/ZnS, InP/ZnS/ZnSe, InPZn/ZnS, InPZn/ZnSe/ZnS, InPZn/ZnS/ZnSe can be used.

In a preferred embodiment of the present invention, said shell layers of the semiconducting light emitting nanoparticle are double shell layers.

Said semiconducting light emitting nanoparticles are publicly available, for example, from Sigma-Aldrich and/or described in, for example, ACS Nano, 2016, 10 (6), pp 5769-5781, Chem. Moter. 2015, 27, 4893-4898, and the international patent application No. WO 2010/095140 A2.

Additional Ligand:

The semiconducting light emitting nanoparticle according to the present invention optionally comprises a different type of surface attaching group in addition to the metal carboxylate, phosphonate or xanthate polymer comprising at least one structural unit (A) and at least on structural unit (B) as defined above.

Accordingly, the outermost surface of the shell layers of the semiconducting light emitting nanoparticle according to the present invention can be over-coated with different types of surface ligands together with/in addition to the metal carboxylate, phosphonate or xanthate polymer as defined above, if desired.

According to an embodiment of the present invention, the amount of the metal carboxylate, phosphonate or xanthate polymer attaching group as defined above is in the range from 30 wt. % to 99.9 wt. % of the total ligands attached onto the outermost surface of the shell layer(s).

Without wishing to be bound by theory, it is believed that such surface ligands can affect that the nanosized fluorescent material is dispersed in a solvent more easily.

The surface ligands in common use include phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Oleylamine, Dedecyl amine (DDA), Tetradecyl amine (TDA), Hexadecyl amine (HDA), and Octadecyl amine (ODA), Oleylamine (OLA), 1-Octadecene (ODE), thiols such as hexadecane thiol and hexane thiol; carboxylic acids such as oleic acid, stearic acid, myristic acid; acetic acid and a combination of any of these.

Examples of surface ligands have been described in, for example, the international patent application No. WO 2012/059931A.

Composition:

The present invention also relates to a composition comprising at least a semiconducting light emitting nanoparticle and a matrix material comprising at least one metal carboxylate polymer, metal phosphonate polymer or metal xanthate polymer, or a combination thereof.

Moreover, the present invention relates to a composition comprising at least a semiconducting light emitting nanoparticle as defined above, which comprises an attaching group that is a metal carboxylate polymer, a metal phosphonate polymer or a metal xanthate polymer, or a combination thereof, comprising at least one structural unit (A) and at least one structural unit (B) as defined above, and a matrix material comprising at least one metal carboxylate polymer, metal phosphonate polymer or metal xanthate polymer, or a combination thereof.

The weight average molecular weight (Mw) of the metal carboxylate, phosphonate or xanthate polymer, or combination thereof, of the matrix material according to the present invention is not particularly limited, but is preferably in the range of 1,000 g/mol to 20,000 g/mol, more preferably in the range of 1,000 g/mol to 10,000 g/mol, particular preferably in the range of 1,000 g/mol to 5,000 g/mol and most preferably in the range of 1,000 g/mol to 2,000 g/mol.

According to a preferred embodiment of the present invention, the matrix material comprises at least one metal carboxylate polymer, metal phosphonate polymer or metal xanthate polymer, or a combination thereof, comprising at least one structural unit (C) and at least one structural unit (D), wherein, structural unit (C) is a straight-chain alkylene group having 1 to 20 C atoms or a branched alkylene group having 3 to 20 C atoms, where one or more H atoms in said straight-chain and branched alkylene groups may in each case be replaced by a group selected from carboxylate, sulfonate, sulfate, carbonate, phosphate, phosphonate and boronate; and structural unit (D) is represented by the following chemical formula (III):

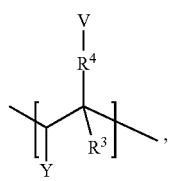

formula (III)

in which $R^3$ denotes a hydrogen, methyl group, ethyl group, propyl group, butyl group, pentyl group, hexyl group, heptyl group, octyl group, nonyl group, or a decyl group, preferably a hydrogen, methyl group, or an ethyl group, more preferably a hydrogen or a methyl group;

$R^4$ denotes a single bond, a straight-chain alkylene group having 1 to 20 C atoms, or branched alkylene group having 3 to 20 C atoms, where one or more non-adjacent methylene structural units (—$CH_2$—) in said straight-chain and branched alkylene groups may in each case be replaced by a sulfonyl group, a carbonyl group, an ether group, a sulfide group, a sulfoxide group, an ester group, an amide group or an imine group, or a straight-chain alkenylene group having 2 to 20 C atoms or a branched alkenylene group having 3 to 20 C atoms, where one or more methylene structural units (—$CH_2$—) in said straight-chain and branched alkenylene groups may in each case be replaced by a sulfonyl group, a carbonyl group, an ether group, a sulfide group, a sulfoxide group, an ester group, an amide group or an imine group;

V denotes a carboxylate group (—COOE), a primary (—PO(OH)(OE)) or secondary (—$PO(OE)_2$) phosphonate group, or a xanthate group (—$OCS_2E$);

Y denotes hydrogen, a carboxyl group (—COOH) or a carboxylate group (—COOZ), a phosphonyl group (—$PO(OH)_2$) or a primary (—PO(OH)(OZ)) or secondary (—$PO(OZ)_2$) phosphonate group, or a xanthate group (—$OCS_2Z$);

E denotes a metal cation selected from $½Zn^{2+}$ or $½Cd^{2+}$ or $⅓ In^{3+}$; and Z denotes a metal cation selected from $½Zn^{2+}$ or $½Cd^{2+}$ or $⅓ In^{3+}$.

Preferably, the metal carboxylate polymer, metal phosphonate polymer or metal xanthate polymer essentially consists of or consists of structural units (C) and (D).

More preferably, structural unit (C) is a straight-chain alkylene group having 1 to 6 C atoms, in which one or more H atoms may be replaced by a group selected from carboxylate, sulfonate, sulfate, carbonate, phosphate, phosphonate and boronate. Preferably, none of the H atoms is replaced.

Moreover, more preferably in structural unit (D) $R^4$ denotes a single bond, so that the group V is directly bound to the polymer chain, for example, a carboxylate group (—COOE) is directly bound to the polymer chain via its C atom.

Moreover, more preferably group V denotes a carboxylate group (—COOE).

Moreover, more preferably group Y denotes hydrogen, a carboxyl group (—COOH) or a carboxylate group (—COOZ), even more preferably hydrogen or a carboxylate group (—COOZ), and most preferably Y is hydrogen.

It is preferable according to the present invention that the above defined metal carboxylate, phosphonate or xanthate polymer comprised in the matrix material comprises about 1 mol % to about 99.9 mol %, preferably about 1 mol % to about 90 mol %, more preferably about 2 mol % to about 50 mol %, and most preferably about 4 mol % to about 20 mol % of the structural unit (D), and about 99 mol % to about 0.1 mol %, preferably about 99 mol % to about 10 mol %, more preferably about 98 mol % to about 50 mol %, and most preferably about 96 mol % to about 80 mol % of the structural unit (C). When the structural unit (D) is included in the metal carboxylate, phosphonate or xanthate polymer within the above ranges, the stability of the matrix is improved It is further preferable according to the present invention that the metal cation is present in the above defined metal carboxylate, phosphonate or xanthate polymer of the matrix material in an amount of about 0.1 to about 1.5 mole, preferably about 0.3 mole to about 1.5 mole, more preferably from about 0.3 mole to 1.0 mole, based on 1 mole of the structural unit (D). Within the above ranges, the metal cation can be easily bound to the carboxylate anion group.

The bond between the metal cation and the carboxylate, phosphonate or xanthate anion group may be a coordinative bond or an ionic bond. As a result of the bond between the metal cation and the carboxylate, phosphonate or xanthate anion group the polymer chains are more tightly adhered to one another to provide a polymer network.

As mentioned above, it is especially preferred according to the present invention that the matrix material comprises at least one metal carboxylate polymer.

Even more preferably, the matrix material comprises at least one metal carboxylate polymer that is selected from zinc poly(alkylene-co-acrylic acid), zinc poly(alkylene-co-methacrylic acid) or zinc poly(alkylene-co-maleic acid) salt. The alkylene structural unit (monomer), corresponding to structural unit (C), is preferably selected from ethylene, n-propylene and n-butylene.

Particularly preferred specific metal carboxylate polymers comprised in the matrix material are zinc poly(ethylene-co-acrylic acid), zinc poly(ethylene-co-methacrylic acid) and zinc poly(ethylene-co-maleic acid), wherein zinc poly(ethylene-co-acrylic acid) is most preferred.

According to the present invention, it is particularly preferred that for the matrix material and for the attaching group of the semiconducting nanoparticle the same metal carboxylate polymer, metal phosphonate polymer or metal xanthate polymer, or a combination thereof, is used. In other words, according to the present invention it is particularly preferred that the metal carboxylate polymer, metal phosphonate polymer or metal xanthate polymer, or a combination thereof, used as or comprised in the matrix material, and the metal carboxylate polymer, metal phosphonate polymer or metal xanthate polymer, or a combination thereof, used as attaching group for the semiconducting light emitting nanoparticle, are identical. This means that in the metal carboxylate, phosphonate or xanthate polymers comprising at least one structural unit (A) and at least one structural unit (B) and in the metal carboxylate, phosphonate or xanthate polymers comprising at least one structural unit (C) and at least one structural unit (D), structural units (A) and (C) and structural units (B) and (D) are identically defined, respectively.

According to a further preferred embodiment of the present invention, the composition comprises one or more transparent matrix materials in addition to the metal carboxylate polymer defined above. According to the present invention, a wide variety of publicly known transparent matrix materials suitable for optical devices can be additionally used.

As used herein, the term "transparent" or "optically transparent" means that at least around 60% of incident light transmits at the thickness used in an optical medium and at a wavelength or a range of wavelength used during operation of an optical medium. Preferably, over 70% of incident light transmits, more preferably over 75%, and most preferably over 80%.

Preferably, the additional transparent matrix material is a transparent polymer. The glass transition temperature (Tg) of the transparent polymer may be 70° C. or more and 250° C. or less. Tg can be measured based on changes in the heat capacity observed in Differential Scanning calorimetry (DSC), as described in http://pslc.ws/macrog/dsc.htm.

Preferred examples of transparent polymers acting as transparent matrix material, one or more of which can be additionally comprised in the composition of the present invention, are selected from silicone resins, siloxane resins, silazane resins, epoxy resins, polyurethanes and poly(meth)acrylates.

The weight average molecular weight of the polymer acting as the transparent matrix material is preferably in the range from 1,000 to 300,000, more preferably from 10,000 to 250,000.

Preferably, the composition comprises as the matrix material at least about 20% by weight of the metal carboxylate, phosphonate or xanthate polymer comprising at least one structural unit (C) and at least one structural unit (D) as defined above, more preferably at least about 50% by weight, based on the total weight of the composition.

According to an embodiment of the present invention, the amount of the metal carboxylate, phosphonate or xanthate polymer attaching group as defined above is in the range from 30 wt. % to 99.9 wt. % of the total ligands attached onto the outermost surface of the shell layer(s).

According to another preferred embodiment, the composition according to the present invention further comprises at least one additional material selected from the group consisting of organic light emitting materials, inorganic light emitting materials, charge transporting materials and scattering particles.

Process:

The problem addressed by the present invention is also solved by a process for preparing a semiconducting light emitting nanoparticle, wherein the method comprises the following step (a), (a) providing the attaching group, i.e., the at least one metal carboxylate polymer, metal phosphonate polymer or metal xanthate polymer, or a combination thereof, comprising at least one structural unit (A) and at least one structural unit (B), and a semiconducting light emitting nanoparticle comprising a core and one or more shell layers into a solvent to get a mixture.

Preferably, said step (a) is carried out under an inert condition such as $N_2$ atmosphere.

Further preferably, step (a) is carried out at the temperature in the range from 60° C. to 0° C., more preferably at room temperature.

Further preferably, in step (a), the metal carboxylate, phosphonate or xanthate polymer comprising at least one structural unit (A) and at least one structural unit (B) and the semiconducting light emitting nanoparticle are stirred for 1 sec or more, more preferably, 30 secs or more. Even more preferably, the stirring time in step (a) is in the range from 1 min to 100 hours.

As the solvent for step (a), for example, toluene, hexane, chloroform, ethyl acetate, benzene, xylene, ethers, tetrahydrofuran, dichloromethane and heptane and a mixture of thereof, can be used, without being limited thereto.

The present invention also relates to a semiconducting light emitting nanoparticle obtainable or obtained from the process.

Formulation:

The present invention furthermore relates to a formulation comprising the semiconducting light emitting nanoparticle as defined above or the composition as defined above, and at least one solvent.

Preferably the said solvent is selected from one or more members of the group consisting of aromatic, halogenated and aliphatic hydrocarbon solvents, more preferably selected from one or more members of the group consisting of toluene, xylene, ethers, tetrahydrofuran, chloroform, dichloromethane and heptane.

The amount of the solvent in the formulation can be freely controlled according to the method of coating the formulation. For example, if the formulation is to be spray-coated, it can contain the solvent in an amount of 90 wt. % or more. Further, if a slit-coating method is to be carried out, which is often adopted in coating a large substrate, the content of the solvent is normally 60 wt. % or more, preferably 70 wt. % or more.

Use:

The present invention furthermore relates to the use of the semiconducting light emitting nanoparticle, or the composition, or the formulation according to the present invention in an electronic device, optical device or in a biomedical device.

Optical Medium:

The present invention in addition relates to an optical medium comprising the semiconducting light emitting nanoparticle or the composition according to the present invention.

In some embodiments of the present invention, the optical medium can be an optical film, for example, a color filter, color conversion film, remote phosphor tape, or another film or filter.

Optical Device:

The invention further relates to an optical device comprising the optical medium according to the invention.

The optical device is preferably a liquid crystal display, Organic Light Emitting Diode (OLED), backlight unit for display, Light Emitting Diode (LED), Micro Electro Mechanical Systems (here in after "MEMS"), electro wetting display, or an electrophoretic display, a lighting device, and/or a solar cell.

The present invention provides for a novel semiconducting light emitting nanoparticle, which shows improved quantum yield and which enables long term stable emission of the semiconducting light emitting nanoparticle. Also, the present invention provides for a matrix material, which increases the initial quantum yield and the quantum yield stability of quantum dots incorporated therein. Further, a novel semiconducting light emitting nanoparticle is provided, which comprises a ligand, in which the attaching group can well cover the surface of the semiconducting light emitting nanoparticle. In addition, a simple preparation process for making an optical medium comprising a semiconductor nanocrystal is provided.

PREFERABLE EMBODIMENTS

1. A semiconducting light emitting nanoparticle comprising at least a core, one or more shell layers and an attaching group attached to the outermost surface of the one or more shell layers,
wherein the attaching group is a metal carboxylate polymer, a metal phosphonate polymer or a metal xanthate polymer, or a combination thereof, comprising at least one structural unit (A) and at least one structural unit (B), wherein,
structural unit (A) is a straight-chain alkylene group having 1 to 20 C atoms or a branched alkylene group having 3 to 20 C atoms, where one or more H atoms in said straight-chain and branched alkylene groups may in each case be replaced by a group selected from carboxylate, sulfonate, sulfate, carbonate, phosphate, phosphonate and boronate; and
structural unit (B) is represented by the following chemical formula (I):

formula (I)

in which:

$R^1$ denotes a hydrogen, methyl group, ethyl group, propyl group, butyl group, pentyl group, hexyl group, heptyl group, octyl group, nonyl group, or a decyl group, preferably a hydrogen, methyl group, or an ethyl group, more preferably a hydrogen or a methyl group;

$R^2$ denotes a single bond, a straight-chain alkylene group having 1 to 20 C atoms, or branched alkylene group having 3 to 20 C atoms, where one or more non-adjacent methylene structural units (—CH$_2$—) in said straight-chain and branched alkylene groups may in each case be replaced by a sulfonyl group, a carbonyl group, an ether group, a sulfide group, a sulfoxide group, an ester group, an amide group or an imine group, or a straight-chain alkenylene group having 2 to 20 C atoms or a branched alkenylene group having 3 to 20 C atoms, where one or more methylene structural units (—CH$_2$—) in said straight-chain and branched alkenylene groups may in each case be replaced by a sulfonyl group, a carbonyl group, an ether group, a sulfide group, a sulfoxide group, an ester group, an amide group or an imine group;

W denotes a carboxylate group (—COOM), a primary (—PO(OH)(OM)) or secondary (—PO(OM)$_2$) phosphonate group, or a xanthate group (—OCS$_2$M);

X denotes hydrogen, a carboxyl group (—COOH) or a carboxylate group (—COOL), a phosphonyl group (—PO(OH)$_2$) or a primary (—PO(OH)(OL)) or secondary (—PO(OL)$_2$) phosphonate group, or a xanthate group (—OCS$_2$L);

M denotes a metal cation selected from ½Zn$^{2+}$ or ½Cd$^{2+}$ or ⅓In$^{3+}$; and L denotes a metal cation selected from ½Zn$^{2+}$ or ½Cd$^{2+}$ or ⅓In$^{3+}$.

2. The nanoparticle according to embodiment 1, wherein the metal carboxylate polymer, metal phosphonate polymer or metal xanthate polymer, or a combination thereof, comprises about 1 mol % to about 99.9 mol % of the structural unit (B) and about 99 mol % to about 0.1 mol % of the structural unit (A).

3. The nanoparticle according to embodiment 1 or 2, wherein the metal cation is present in the metal carboxylate polymer, metal phosphonate polymer or metal xanthate polymer, or a combination thereof, in an amount of about 0.1 to about 1.5 mole, based on 1 mole of the structural unit (B).

4. The nanoparticle according to any one of embodiments 1 to 3, wherein
structural unit (A) is a straight-chain alkylene group having 1 to 6 C atoms, in which one or more H atoms may be replaced by a group selected from carboxylate, sulfonate, sulfate, carbonate, phosphate, phosphonate and boronate.

5. The nanoparticle according to any one of embodiments 1 to 4, wherein in structural unit (B) $R^2$ denotes a single bond and/or W denotes a carboxylate group (—COOM).

6. The nanoparticle according to any one of embodiments 1 to 5, wherein in structural unit (B) X denotes hydrogen, a carboxyl group (—COOH) or a carboxylate group (—COOL).

7. The nanoparticle according to any one of embodiments 1 to 6, wherein the attaching group is a metal carboxylate polymer selected from zinc poly(alkylene-co-acrylic acid), zinc poly(alkylene-co-methacrylic acid) and zinc poly(alkylene-co-maleic acid) salt.

8. The nanoparticle according to embodiment 7, wherein the alkylene structural unit (monomer) is selected from ethylene, n-propylene and n-butylene.

9. The nanoparticle according to any one of embodiments 1 to 8, wherein the metal carboxylate polymer is zinc poly(ethylene-co-acrylic acid), zinc poly(ethylene-co-methacrylic acid) or zinc poly(ethylene-co-maleic acid).

10. The nanoparticle according to any one of embodiments 1 to 9, wherein at least one of the shell layers comprises at least a 1$^{st}$ element of group 12 of the periodic table, preferably Zn or Cd,
and a 2$^{nd}$ element of group 16 of the periodic table, preferably S, Se, or Te.

11. The nanoparticle according to any one of embodiments 1 to 10, wherein at least one shell layer is represented by following formula (II),

$$ZnS_xSe_yTe_z, \quad \text{formula (II)}$$

in which 0≤x≤1, 0≤y≤1, 0≤z≤1, and x+y+z=1, preferably 0≤x≤1, 0≤y≤1, z=0, and x+y=1.

12. The nanoparticle according to any one of embodiments 1 to 11, wherein the one or more shell layers of the semiconducting light emitting nanoparticle are double shell layers.

13. The nanoparticle according to any one of embodiments 1 to 12, wherein the core comprises at least In and P atoms.

14. A composition comprising at least a semiconducting light emitting nanoparticle and a matrix material comprising at least one metal phosphonates, xanthates, or a metal carboxylate polymer.

15. A composition comprising at least a semiconducting light emitting nanoparticle according to any one of embodiments 1 to 13 and a matrix material comprising at least one metal carboxylate polymer, metal phosphonate polymer or metal xanthate polymer, or a combination thereof.

16. The composition according to embodiment 14 or 15, wherein the matrix material comprises at least one metal carboxylate polymer, metal phosphonate polymer or metal xanthate polymer, or a combination thereof, comprising at least one structural unit (C) and at least one structural unit (D), wherein,
structural unit (C) is a straight-chain alkylene group having 1 to 20 C atoms or a branched alkylene group having 3 to 20 C atoms, where one or more H atoms in said straight-chain and branched alkylene groups may in each case be replaced by a group selected from carboxylate, sulfonate, sulfate, carbonate, phosphate, phosphonate and boronate; and
structural unit (D) is represented by the following chemical formula (III):

formula (III)

in which
$R^3$ denotes a hydrogen, methyl group, ethyl group, propyl group, butyl group, pentyl group, hexyl group, heptyl group, octyl group, nonyl group, or a decyl group, preferably a hydrogen, methyl group, or an ethyl group, more preferably a hydrogen or a methyl group;

$R^4$ denotes a single bond, a straight-chain alkylene group having 1 to 20 C atoms, or branched alkylene group having 3 to 20 C atoms, where one or more non-adjacent methylene structural units (—CH$_2$—) in said straight-chain and branched alkylene groups may in each case be replaced by a sulfonyl group, a carbonyl group, an ether group, a sulfide group, a sulfoxide group, an ester group, an amide group or an imine group, or a straight-chain alkenylene group having 2 to 20 C atoms or a branched alkenylene group having 3 to 20 C atoms, where one or more methylene structural units (—CH$_2$—) in said straight-chain and branched alkenylene groups may in each case be replaced by a sulfonyl group, a carbonyl group, an ether group, a sulfide group, a sulfoxide group, an ester group, an amide group or an imine group;

V denotes a carboxylate group (—COOE), a primary (—PO(OH)(OE)) or secondary (—PO(OE)$_2$) phosphonate group, or a xanthate group (—OCS$_2$E);

Y denotes hydrogen, a carboxyl group (—COOH) or a carboxylate group (—COOZ), a phosphonyl group (—PO(OH)$_2$) or a primary (—PO(OH)(OZ)) or secondary (—PO(OZ)$_2$) phosphonate group, or a xanthate group (—OCS$_2$Z);

E denotes a metal cation selected from ½Zn$^{2+}$ or ½Cd$^{2+}$ or ⅓In$^{3+}$; and Z denotes a metal cation selected from ½Zn$^{2+}$ or ½Cd$^{2+}$ or ⅓In$^{3+}$.

17. The composition according to any one of embodiments 14 to 16, wherein the metal carboxylate polymer, metal phosphonate polymer or metal xanthate polymer, or a combination thereof, comprises about 1 mol % to about 99.9 mol % of the structural unit (D) and about 99 mol % to about 0.1 mol % of the structural unit (C).

18. The composition according to any one of embodiments 14 to 17, wherein the metal cation is present in the metal carboxylate polymer, metal phosphonate polymer or metal xanthate polymer, or a combination thereof, the metal carboxylate polymer in an amount of about 0.1 to about 1.5 mole, based on 1 mole of the structural unit (D).

19. The composition according to any one of embodiments 14 to 18, wherein structural unit (C) is a straight-chain alkylene group having 1 to 6 C atoms, in which one or more H atoms may be replaced by a group selected from carboxylate, sulfonate, sulfate, carbonate, phosphate, phosphonate and boronate.

20. The composition according to any one of embodiments 14 to 19, wherein in structural unit (D) R$^4$ denotes a single bond and/or V denotes a carboxylate group (—COOE).

21. The composition according to any one of embodiments 14 to 20, wherein in structural unit (D) Y denotes hydrogen, a carboxyl group (—COOH) or a carboxylate group (—COOZ).

22. The composition according to any one of embodiments 14 to 21, wherein the matrix material comprises at least one metal carboxylate polymer selected from zinc poly(alkylene-co-acrylic acid), zinc poly(alkylene-co-methacrylic acid) and zinc poly(alkylene-co-maleic acid) salt.

23. The composition according to embodiment 22, wherein the alkylene structural unit (monomer) is selected from ethylene, n-propylene and n-butylene.

24. The composition according to any one of embodiments 14 to 23, wherein the at least one metal carboxylate polymer is zinc poly(ethylene-co-acrylic acid), zinc poly(ethylene-co-methacrylic acid) or zinc poly(ethylene-co-maleic acid).

25. The composition according to any one of embodiments 14 to 24, further comprising one or more matrix materials selected from silicone resins, siloxane resins, silazane resins, epoxy resins, polyurethanes and poly(meth)acrylates.

26. The composition according to any one of embodiments 14 to 25, wherein said composition comprises as the matrix material at least about 20% by weight of the metal carboxylate polymer, metal phosphonate polymer or metal xanthate polymer, or a combination thereof, based on the total weight of the composition.

27. The composition according to any one of embodiments 14 to 26, further comprising at least one additional material selected from the group consisting of organic light emitting materials, inorganic light emitting materials, charge transporting materials, and scattering particles.

28. A process for preparing a semiconducting light emitting nanoparticle according to any one of embodiments 1 to 13, wherein the process comprises the following step (a):

(a) providing the metal carboxylate polymer, metal phosphonate polymer or metal xanthate polymer, or a combination thereof, comprising at least one structural unit (A) and at least one structural unit (B), and a semiconducting light emitting nanoparticle comprising a core and one or more shell layers into a solvent to get a mixture.

29. A semiconducting light emitting nanoparticle obtainable or obtained from the process according to embodiment 28.

30. Formulation comprising the semiconducting light emitting nanoparticle according to any one of embodiments 1 to 13, 29 or the composition according to any one of embodiments 14 to 27 and at least one solvent, preferably the solvent is selected from one or more members of the group consisting of aromatic, halogenated and aliphatic hydrocarbons solvents, more preferably selected from one or more members of the group consisting of toluene, xylene, ethers, tetrahydrofuran, chloroform, dichloromethane and heptane.

31. Use of the semiconducting light emitting nanoparticle according to any one of embodiments 1 to 13, 29, or the composition according to any one of embodiments 14 to 27, or the formulation according to embodiment 30 in an electronic device, optical device or in a biomedical device.

32. An optical medium comprising said semiconducting light emitting nanoparticle according to any one of embodiments 1 to 13, 29, or the composition according to any one of embodiments 14 to 27.

33. An optical device comprising said optical medium according to embodiment 32.

Definition of Terms

As used herein, the term "semiconductor" means a material that has electrical conductivity to a degree between that of a conductor (such as copper) and that of an insulator (such as glass) at room temperature. Preferably, a semiconductor is a material whose electrical conductivity increases with the temperature.

As used herein, the term "nanosized" means the size in between 0.1 nm and 999 nm, preferably 1 nm to 150 nm, more preferably 3 nm to 100 nm.

As used herein, the term "polymer" means a material having one or more repeating units and a weight average molecular weight of 1000 or more.

As used herein, the term "emission" means the emission of electromagnetic waves by electron transitions in atoms and molecules.

The working examples 1-4 below provide descriptions of the present invention, as well as a detailed description of their preparation.

WORKING EXAMPLES

Working Example 1

Preparation of PEAA-Zn-Quantum Material Film:

50 mg of zinc poly(ethylene-co-acrylic acid) (PEAA-Zn) are added to 1.8 g THF. The solution is heated to 60° C. in order to dissolve the PEAA-Zn. Following dissolution, the temperature is lowered to 50° C. 1 mL of a 5% (% w/v) solution of a quantum material InP/ZnS quantum dots in toluene is added to the THF/PEAA-Zn solution. The vessel is purged with argon and is left stirring for 2 hours at 50° C. to thereby obtain a first PEAA-Zn/quantum material/THF solution.

For the film preparation, a second solution of PEAA-Zn in THF is made by adding 2 g of PEAA-Zn to 10 g of THF. To this solution 3 mL of the first PEAA-Zn/quantum material/THF solution are added, and the combined solutions are mixed for several minutes at 50° C. The solution thus obtained is deposited on a glass substrate by spin-coating.

Comparative Example 1

A poly(methyl methacrylate) (PMMA)-quantum material film is prepared in the same manner as described in working example 1, except that PEAA-Zn is not used.

Working Example 2: Measurement of Relative Quantum Yield (QY) Values of the Samples The QY over time of the quantum materials in the PEAA-Zn-quantum material film obtained in working example 1 and in the PMMA-quantum material film obtained in comparative example 1 is measured using a Hamamatsu Quantaurus absolute PL quantum yield spectrometer model c11347-11.

Referring to FIG. 1, measurements are done under different conditions: room conditions (room temperature=23° C.; "RT"), every 24 hours, after illumination of 450 nm light at an intensity of 15 mW/cm$^2$ for 7 days ("Light"), and after heat and moisture treatment by heating the respective films in an oven at 85° C. under a humid environment of 85% of relative humidity ("85/85").

As can be seen from FIG. 1, the quantum material in the PEAA-Zn film shows a higher stability under all conditions when compared with the non-functionalized PMMA film.

Working Example 3: Measurement of Relative Central Wave Length (CWL) Values of the Samples The CWL over time of the quantum materials in the PEAA-Zn-quantum material film obtained in working example 1 and in the PMMA-quantum material film obtained in comparative example 1 is measured using a Hamamatsu Quantaurus absolute PL quantum yield spectrometer model c11347-11.

Figure 2:
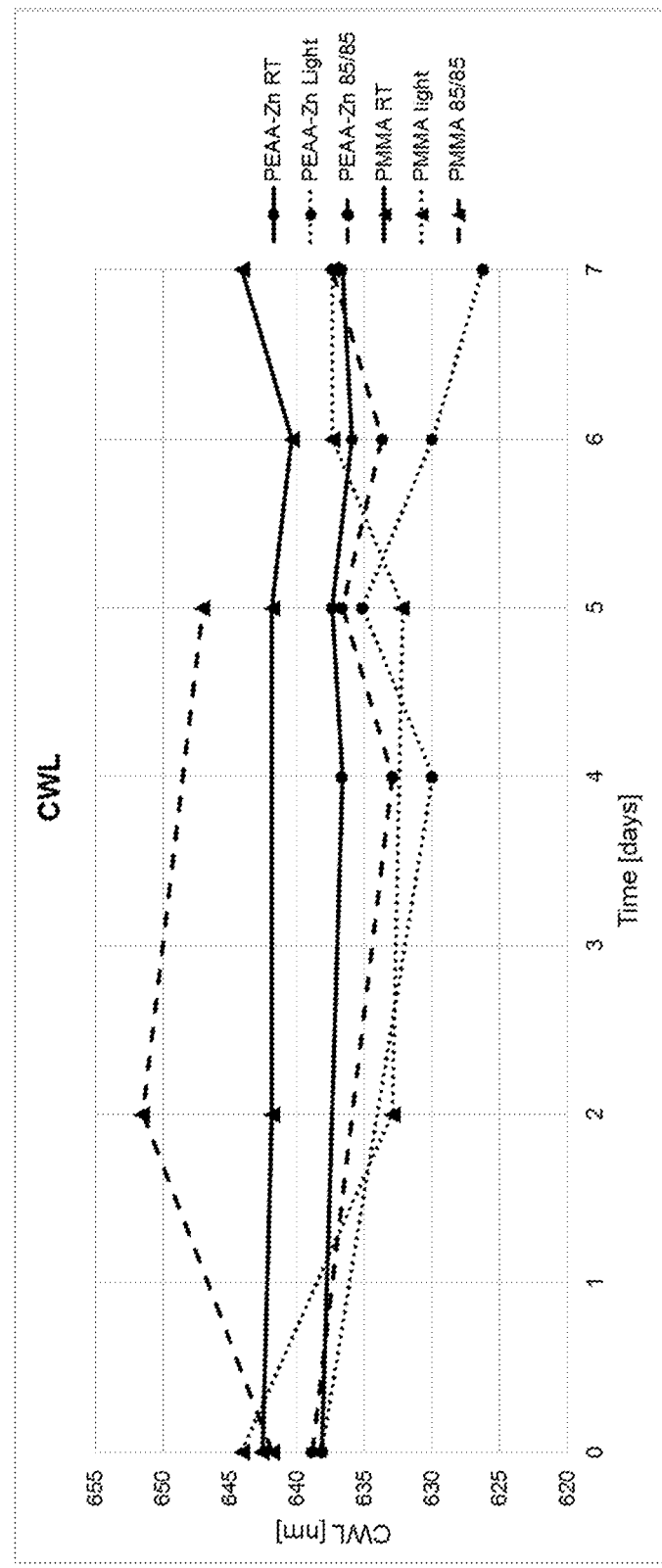
FIG. 2 is a graph of central wave length over time showing the change of central wave length of quantum material containing films obtained from working example 1 and comparative example 1, each measured at different conditions.

Referring to FIG. 2, measurements are done under different conditions: room conditions (room temperature=23° C.; "RT"), every 24 hours, after illumination of 450 nm light at an intensity of 15 mW/cm$^2$ for 7 days ("Light"), and after heat and moisture treatment by heating the respective films in an oven at 85° C. under a humid environment of 85% of relative humidity ("85/85").

As can be seen from FIG. 2, CWL of the quantum material in the PEAA-Zn film remains almost unchanged under the different measurement conditions.

Working Example 4: Measurement of Relative Full Width Half Maximum (FWHM) Values of the Samples The FWHM over time of the quantum materials in the PEAA-Zn-quantum material film obtained in working example 1 and in the PMMA-quantum material film obtained in comparative example 1 is measured using a Hamamatsu Quantaurus absolute PL quantum yield spectrometer model c11347-11.

Figure 3:
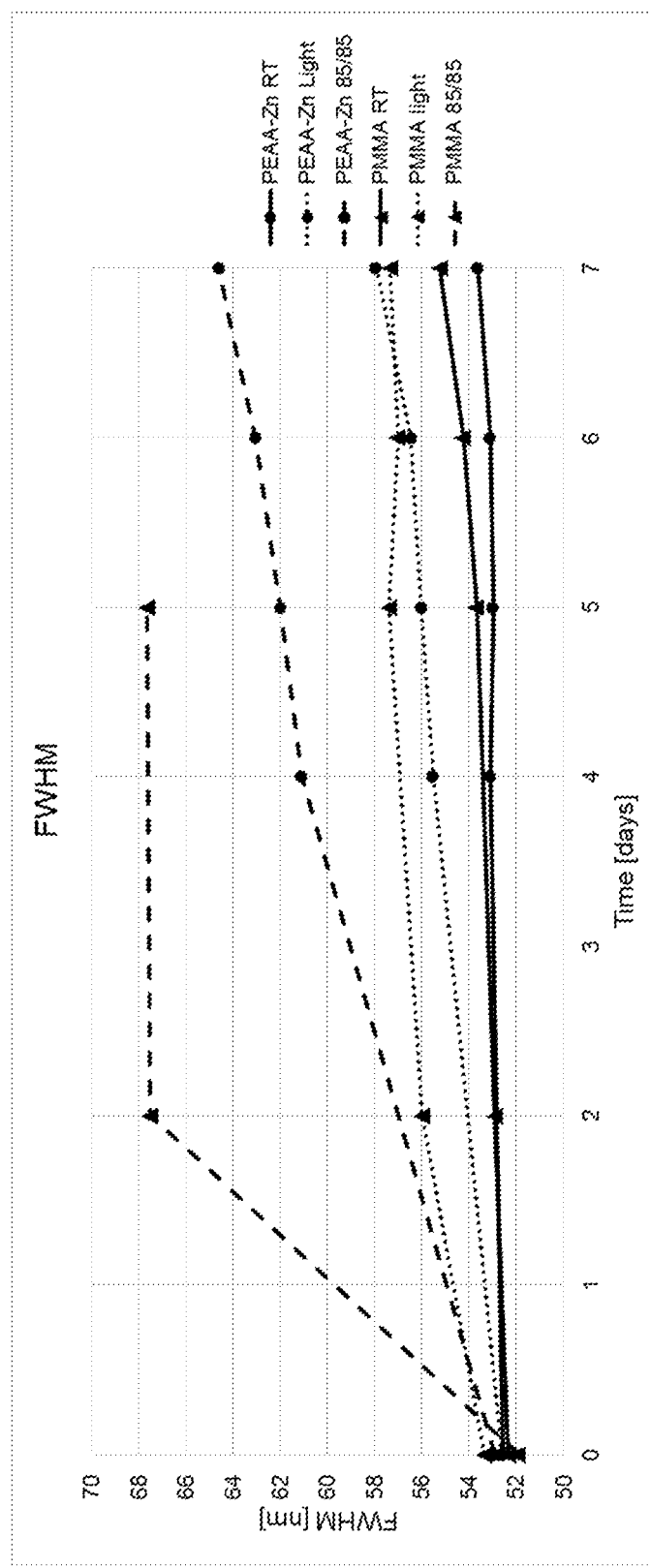
FIG. 3 is a graph of full width half maximum over time showing the change of full width half maximum of quantum material containing films obtained from working example 1 and comparative example 1, each measured at different conditions.

Referring to FIG. 3, measurements are done every 24 hours under different conditions: room conditions (room temperature=23° C.; "RT"), after illumination of 450 nm light at an intensity of 15 mW/cm$^2$ for 7 days ("Light"), and after heat and moisture treatment by heating the respective films in an oven at 85° C. under a humid environment of 85% of relative humidity ("85/85").

As can be seen from FIG. 3, FWHM value of the quantum material in the PEAA-Zn film is much better than the FWHM values of the quantum materials in PMMA films under the different measurement conditions.

The invention claimed is:

1. A composition comprising at least a semiconducting light emitting nanoparticle and a matrix material comprising at least one metal phosphonates polymer, metal xanthate, or a metal carboxylate polymer,
    wherein said one metal phosphonate polymer, metal xanthate, or a metal carboxylate polymer comprised in the matrix material is not bounding to the surface of the semiconducting light emitting nanoparticle.
2. The composition of claim 1
    wherein said semiconducting light emitting nanoparticle comprises at least a core, one or more shell layers and an attaching group attached to the outermost surface of the one or more shell layers,
    wherein the attaching group is a metal carboxylate polymer, a metal phosphonate polymer or a metal xanthate polymer, or a combination thereof, comprising at least one structural unit (A) and at least one structural unit (B),
    wherein, structural unit (A) is a straight-chain alkylene group having 1 to 20 C atoms or a branched alkylene group having 3 to 20 C atoms, where one or more H atoms in said straight-chain and branched alkylene groups may in each case be replaced by a group selected from carboxylate, sulfonate, sulfate, carbonate, phosphate, phosphonate and boronate; and
    structural unit (B) is represented by the following chemical formula (I):

formula (I)

in which:
    $R^1$ denotes a hydrogen, methyl group, ethyl group, propyl group, butyl group, pentyl group, hexyl group, heptyl group, octyl group, nonyl group, or a decyl group, preferably a hydrogen, methyl group, or an ethyl group, more preferably a hydrogen or a methyl group;

R² denotes a single bond, a straight-chain alkylene group having 1 to 20 C atoms, or branched alkylene group having 3 to 20 C atoms, where one or more non-adjacent methylene structural units (—CH₂—) in said straight-chain and branched alkylene groups may in each case be replaced by a sulfonyl group, a carbonyl group, an ether group, a sulfide group, a sulfoxide group, an ester group, an amide group or an imine group, or a straight-chain alkenylene group having 2 to 20 C atoms or a branched alkenylene group having 3 to 20 C atoms, where one or more methylene structural units (—CH₂—) in said straight-chain and branched alkenylene groups may in each case be replaced by a sulfonyl group, a carbonyl group, an ether group, a sulfide group, a sulfoxide group, an ester group, an amide group or an imine group;

W denotes a carboxylate group (—COOM), a primary (—PO(OH)(OM)) or secondary (—PO(OM)$_2$) phosphonate group, or a xanthate group (—OCS$_2$M);

X denotes hydrogen, a carboxyl group (—COOH) or a carboxylate group (—COOL), a phosphonyl group (—PO(OH)$_2$) or a primary (—PO(OH)(OL)) or secondary (—PO(OL)$_2$) phosphonate group, or a xanthate group (—OCS$_2$L);

M denotes a metal cation selected from ½Zn²⁺ or ½Cd²⁺ or ⅓In³⁺; and

L denotes a metal cation selected from ½Zn²⁺ or ½Cd²⁺ or ⅓In³⁺.

3. The composition of claim 2, wherein structural unit (A) is a straight-chain alkylene group having 1 to 6 C atoms, in which one or more H atoms may be replaced by a group selected from carboxylate, sulfonate, sulfate, carbonate, phosphate, phosphonate and boronate.

4. The composition of claim 2, wherein structural unit (B) R² denotes a single bond and/or W denotes a carboxylate group (—COOM).

5. The composition of claim 2, wherein the attaching group is a metal carboxylate polymer selected from zinc poly(alkylene-co-acrylic acid), zinc poly(alkylene-co-methacrylic acid) and zinc poly(alkylene-co-maleic acid) salt.

6. The composition according to claim 1, wherein the matrix material comprises at least one metal carboxylate polymer, metal phosphonate polymer or metal xanthate polymer, or a combination thereof, comprising at least one structural unit (C) and at least one structural unit (D), wherein, structural unit (C) is a straight-chain alkylene group having 1 to 20 C atoms or a branched alkylene group having 3 to 20 C atoms, where one or more H atoms in said straight-chain and branched alkylene groups may in each case be replaced by a group selected from carboxylate, sulfonate, sulfate, carbonate, phosphate, phosphonate and boronate; and structural unit (D) is represented by the following chemical formula (III):

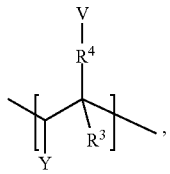

formula (III)

in which

R³ denotes a hydrogen, methyl group, ethyl group, propyl group, butyl group, pentyl group, hexyl group, heptyl group, octyl group, nonyl group, or a decyl group, preferably a hydrogen, methyl group, or an ethyl group, more preferably a hydrogen or a methyl group;

R⁴ denotes a single bond, a straight-chain alkylene group having 1 to 20 C atoms, or branched alkylene group having 3 to 20 C atoms, where one or more non-adjacent methylene structural units (—CH₂—) in said straight-chain and branched alkylene groups may in each case be replaced by a sulfonyl group, a carbonyl group, an ether group, a sulfide group, a sulfoxide group, an ester group, an amide group or an imine group, or a straight-chain alkenylene group having 2 to 20 C atoms or a branched alkenylene group having 3 to 20 C atoms, where one or more methylene structural units (—CH₂—) in said straight-chain and branched alkenylene groups may in each case be replaced by a sulfonyl group, a carbonyl group, an ether group, a sulfide group, a sulfoxide group, an ester group, an amide group or an imine group;

V denotes a carboxylate group (—COOE), a primary (—PO(OH)(OE)) or secondary (—PO(OE)$_2$) phosphonate group, or a xanthate group (—OCS$_2$E);

Y denotes hydrogen, a carboxyl group (—COOH) or a carboxylate group (—COOZ), a phosphonyl group (—PO(OH)$_2$) or a primary (—PO(OH)(OZ)) or secondary (—PO(OZ)$_2$) phosphonate group, or a xanthate group (—OCS$_2$Z);

E denotes a metal cation selected from ½Zn²⁺ or ½Cd²⁺ or ⅓In³⁺; and

Z denotes a metal cation selected from ½Zn²⁺ or ½Cd²⁺ or ⅓In³⁺.

7. The composition according to claim 6, wherein the metal cation is present in the metal carboxylate polymer, metal phosphonate polymer or metal xanthate polymer, or a combination thereof, the metal carboxylate polymer in an amount of about 0.1 to about 1.5 mole, based on 1 mole of the structural unit (D).

8. The composition according to claim 6, wherein structural unit (C) is a straight-chain alkylene group having 1 to 6 C atoms, in which one or more H atoms may be replaced by a group selected from carboxylate, sulfonate, sulfate, carbonate, phosphate, phosphonate and boronate.

9. The composition according to claim 6, wherein in structural unit (D) R⁴ denotes a single bond and/or V denotes a carboxylate group (—COOE).

10. The composition according to claim 6, wherein in structural unit (D) Y denotes hydrogen, a carboxyl group (—COOH) or a carboxylate group (—COOZ).

11. The composition according to claim 6, wherein the alkylene structural unit is selected from ethylene, n-propylene and n-butylene.

12. The composition according to claim 1, wherein the matrix material comprises at least one metal carboxylate polymer selected from zinc poly(alkylene-co-acrylic acid), zinc poly(alkylene-co-methacrylic acid) and zinc poly(alkylene-co-maleic acid) salt.

13. The composition according to claim 12, wherein the at least one metal carboxylate polymer is zinc poly(ethylene-co-acrylic acid), zinc poly(ethylene-co-methacrylic acid) or zinc poly(ethylene-co-maleic acid).

14. Formulation comprising the composition of claim 1 and at least one solvent, preferably the solvent is selected from one or more members of the group consisting of aromatic, halogenated and aliphatic hydrocarbons solvents, more preferably selected from one or more members of the group consisting of toluene, xylene, ethers, tetrahydrofuran, chloroform, dichloromethane and heptane.

15. An electronic device, optical device or biomedical device comprising the composition of claim 1.

16. An optical medium comprising the composition of claim 1.

17. An optical device comprising said optical medium according to claim 16.

* * * * *